United States Patent [19]
Hilton et al.

[11] Patent Number: 5,907,102
[45] Date of Patent: May 25, 1999

[54] SYSTEM AND METHOD FOR PERFORMING TENSILE STRESS-STRAIN AND FATIGUE TESTS

[75] Inventors: David K. Hilton; Huub W. Weijers; Yusuf S. Hascicek; Steven W. Van Sciver, all of Tallahassee, Fla.

[73] Assignee: Florida State University, Tallahassee, Fla.

[21] Appl. No.: 08/874,204

[22] Filed: Apr. 15, 1997

[51] Int. Cl.⁶ ........................................................ G01B 7/16
[52] U.S. Cl. .................................. 73/777; 73/779; 73/780
[58] Field of Search ............................. 73/763, 774, 777, 73/779, 780

[56] References Cited

U.S. PATENT DOCUMENTS

| | | | |
|---|---|---|---|
| 3,729,991 | 5/1973 | Hardway, Jr. ........................ | 73/862.337 |
| 3,945,242 | 3/1976 | Ulyanov et al. ......................... | 387/814 |
| 4,236,109 | 11/1980 | Ingle, Jr. ................................... | 73/780 |
| 5,114,664 | 5/1992 | Terhune .................................... | 73/724 |
| 5,174,159 | 12/1992 | Jacobsen et al. ......................... | 73/780 |
| 5,317,919 | 6/1994 | Awtrey ...................................... | 73/724 |
| 5,576,483 | 11/1996 | Bonin ....................................... | 73/105 |

FOREIGN PATENT DOCUMENTS

| | | | |
|---|---|---|---|
| 691-714 | 10/1979 | U.S.S.R. . | |
| 1061-038 | 12/1983 | U.S.S.R. ......................... | G01N 27/90 |

OTHER PUBLICATIONS

J. Neighbours, et al., Phys. Rev. 111, p. 707, 1958.
Rabukhin, et al., "Low–Temperature Setup for Measuring Stresses, Strains, and Internal Friction in Uniaxial Tension of Hyperfine Crystals," Automobile and Road Transport Institute, vol. 40, ln. 8, pp. 1018–1019, Aug. 1974.

J. Yau, et al., "Strain Tolerance of Multifilament BiPbSr-CaCuO Silver Composite Supercoonducting Tapes," Appl. Phys. Lett., 55(11), pp. 1454–1456, Sep. 1994.

1995 NHMFL Annual Report, pp. 143–144.

B. ten Haken et al., "A Descriptive Model for the Critical Current as a Function of Axial Strain in Bi–2212/Ag Wires," IEEE Trans. Mag., Jul. 1996.

Schwartz, et al., "Mechanical Properties and Strain Effects in $Bi_2Sr_2CaCu_2O_x$/AgMg Composite Conductors," Aug. 26, 1996, 4 pages.

Primary Examiner—Max H. Noori
Attorney, Agent, or Firm—Senniger, Powers, Leavitt & Roedel

[57] ABSTRACT

A stress-strain test for conductors. A test assembly receives first and second conductive layers and a dielectric layer adjacent each of the conductive layers. The layers are generally ring-shaped and concentric when received by the test assembly and the dielectric layer separates the conductive layers from each other. A magnetic field source provides a magnetic field to the test assembly and a variable current source provides current to the second conductive layer. A circuit measures a change in capacitance between the conductive layers when the current in the second conductive layer is varied whereby the stress and strain characteristics of the second conductive layer are determined as a function of the capacitance change.

21 Claims, 7 Drawing Sheets

SYSTEM AND METHOD FOR PERFORMING TENSILE STRESS-STRAIN AND FATIGUE TESTS

This invention was made with Government support under Cooperative Agreement No. DMR-9016241 awarded by the National Science Foundation. The Government has certain rights in this invention.

BACKGROUND OF THE INVENTION

The present invention relates generally to tensile test and fatigue measuring devices and particularly to a test system for measuring Lorentz force tensile stress5 strain and critical current density fatigue characteristics of conductors in situ.

The stress, strain, and fatigue characteristics of conductive materials determine the applications of such materials. For example, in conductors such as $Bi_2Sr_2CaCu_2O_x$/Ag (BSCCO/Ag) and Ag-alloy composite superconductors that have a relatively high critical current density, $J_c$, large strains can cause irreversible damage to the conductors. Likewise, crack propagation from fatigue at low strains can limit the uses of the conductors. These forces can also affect the superconducting properties of the conductors. For example, the local peak strain within the superconductor filaments of a composite ceramic superconductor can limit its coil properties during high field operation in a superconducting magnet. Further, cycling at low strain may degrade the critical current density and, thus, the superconducting properties, of superconducting tapes. Such fatigue behavior may relate to the fundamental $J_c$ limit and limit other applications of these superconductors as well.

The conventional tensile test system determines the stress-strain relationship of a conductor by mechanically pulling the conductor and comparing the applied force to the amount that the conductor is deformed. Due to the small size of a typical BSCCO/AgX superconducting tape, standard testing machines (i.e., hydraulic and pneumatic MTS type apparatus) are unusable for determining the stress, strain and fatigue characteristics of such tapes. Further, the loads required to fail such tapes usually do not exceed 200 N (45 lbf) which is less than the typical minimum load of conventional test apparatus. Also, these superconducting tapes are often very thin (e.g., having a width to thickness ratio on the order of 20 or more) which necessitates special gripping techniques by the conventional test apparatus. Thus, smaller and more sensitive instrumentation is desired to perform mechanical stress testing.

One such test apparatus is a table-top mechanical testing device operating at room temperature and employing a linear stepper motor capable of delivering 330 N (75 lbf) to a sample. This device uses relatively small 50 and 150 lbf load cells and linear variable displacement transducers (LVDT) for measurement of applied load and displacement. The typical load cell has a resolution of 6.0 mN and the typical LVDT has a resolution of 0.6 $\mu$m. In operation, the sample to be tested is placed between a set of grips and pulled. The device accommodates samples of 30 to 50 mm, for example, and runs the samples through a tensile test until failure or a fatigue test using either a strain limit or a test limit.

Disadvantageously, conventional test apparatus fail to provide an indication of stress and fatigue behavior at normal operating temperatures and subject to the actual forces which may eventually cause failure (i.e., magnetic stresses due to Lorentz forces in a magnet). For this reason, an in situ test system which approximates normal operating conditions is desired.

SUMMARY OF THE INVENTION

Among the several objects of this invention may be noted the provision of a system and method for determining the stress, strain and fatigue characteristics of a conductive sample; the provision of such system and method which approximate normal operating conditions; the provision of such system and method which provide testing of the sample at cryogenic temperatures; the provision of such system and method which subject the sample to magnetic stresses caused by Lorentz forces; and the provision of such system and method which are economically feasible and commercially practical.

Briefly described, a system embodying aspects of the invention is for determining stress-strain characteristics. The system includes a test assembly adapted to receive first and second conductive layers and a dielectric layer adjacent each of the conductive layers. The layers are generally ring-shaped and concentric when received by the test assembly and the dielectric layer separates the conductive layers from each other. The system also includes a magnetic field source applying a magnetic field to the test assembly and a variable current source providing current to the second conductive layer. The system further includes a circuit for measuring a change in capacitance between the conductive layers when the current in the second conductive layer is varied. In this manner, the system determines the stress and strain characteristics of the second conductive layer as a function of the capacitance change.

Another embodiment of the invention is directed to a method for determining stress-strain characteristics. The method includes the step of providing a capacitive element having first and second conductive layers separated by a dielectric layer. The layers of the capacitive element are generally ring-shaped and concentric. The method also includes positioning the capacitive element in a magnetic field and providing a current to the second conductive layer. The method further includes the steps of varying the current and measuring the change in capacitance between the conductive layers of the capacitive element when the current in the second conductive layer is varied. In this manner, the stress and strain characteristics of the second conductive layer are determined as a function of the capacitance change.

In yet another embodiment, a test assembly embodying aspects of the invention is for use in determining stress-strain characteristics. The test assembly includes a generally circular disk adapted to be positioned in a magnetic field applied by a magnetic field source. A first conductive layer is positioned around the periphery of the disk and a dielectric layer is positioned on the first conductive layer. A second conductive layer is positioned on the dielectric layer which separates the first and second conductive layers. The second conductive layer comprises a sample and the layers are generally ring-shaped and concentric when positioned on the disk. The test assembly also includes leads adapted to connect the second conductive layer to a current source.

Other objects and features will be in part apparent and in part pointed out hereinafter.

BRIEF DESCRIPTION OF THE DRAWINGS

Corresponding reference characters indicate corresponding parts through the drawings.

DETAILED DESCRIPTION OF PREFERRED EMBODIMENTS

Figure 1:
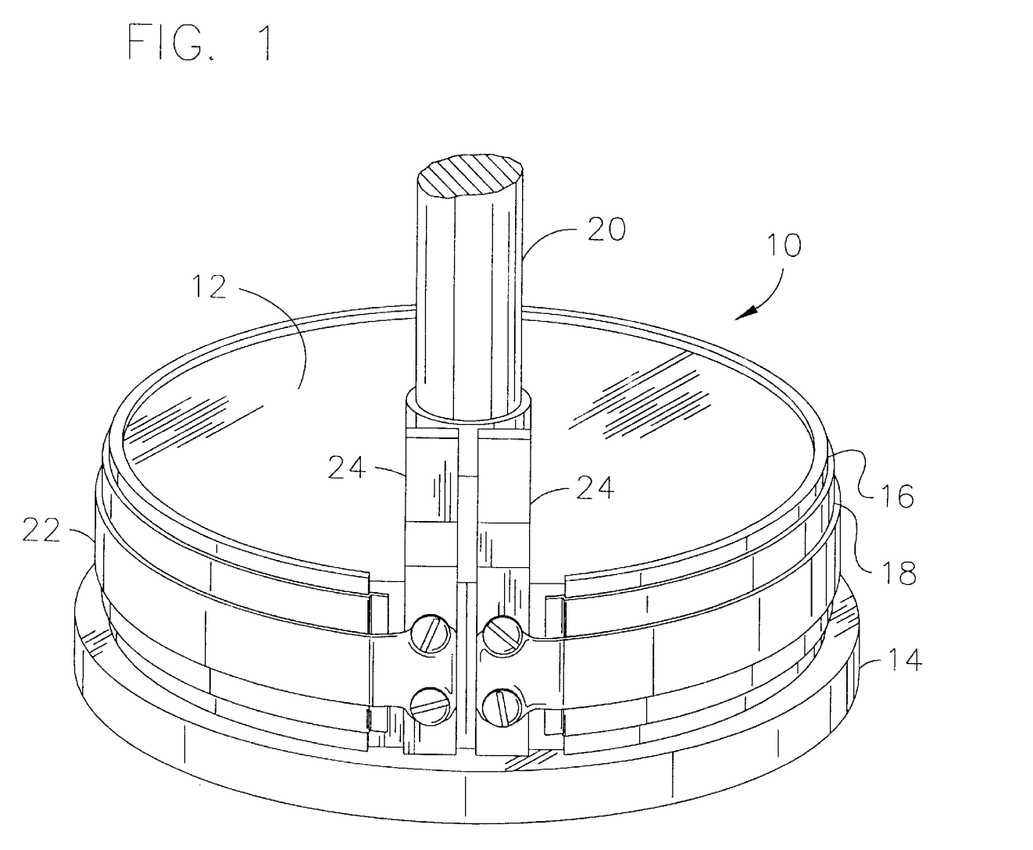
FIG. 1 is a perspective of a test assembly for holding a sample of a conductor to be tested according to a preferred embodiment of the invention.

Referring now to the drawings, FIG. 1 illustrates a test assembly 10 embodying aspects of the present invention for use in performing tensile stress-strain tests on various conductors. In a preferred embodiment, the test assembly 10 comprises a disk 12 made of an insulative material such as a fiberglass/epoxy composite referred to as G-10. As shown, the disk 12 has a flange 14 about its periphery upon which a strip 16 of copper or other good conductor rests. Preferably, the copper strip 16, which constitutes a first layer of conductive material positioned about the periphery of disk 12, is biased against disk 12 by spring tension. A dielectric layer 18 (e.g., a relatively thin strip of dielectric tape, such as Kapton® tape manufactured by DuPont) covers copper strip 16. FIG. 1 also illustrates a support rod 20 fastened to disk 10. Preferably, the support rod 20 is also made from G-10.

Figure 2A:
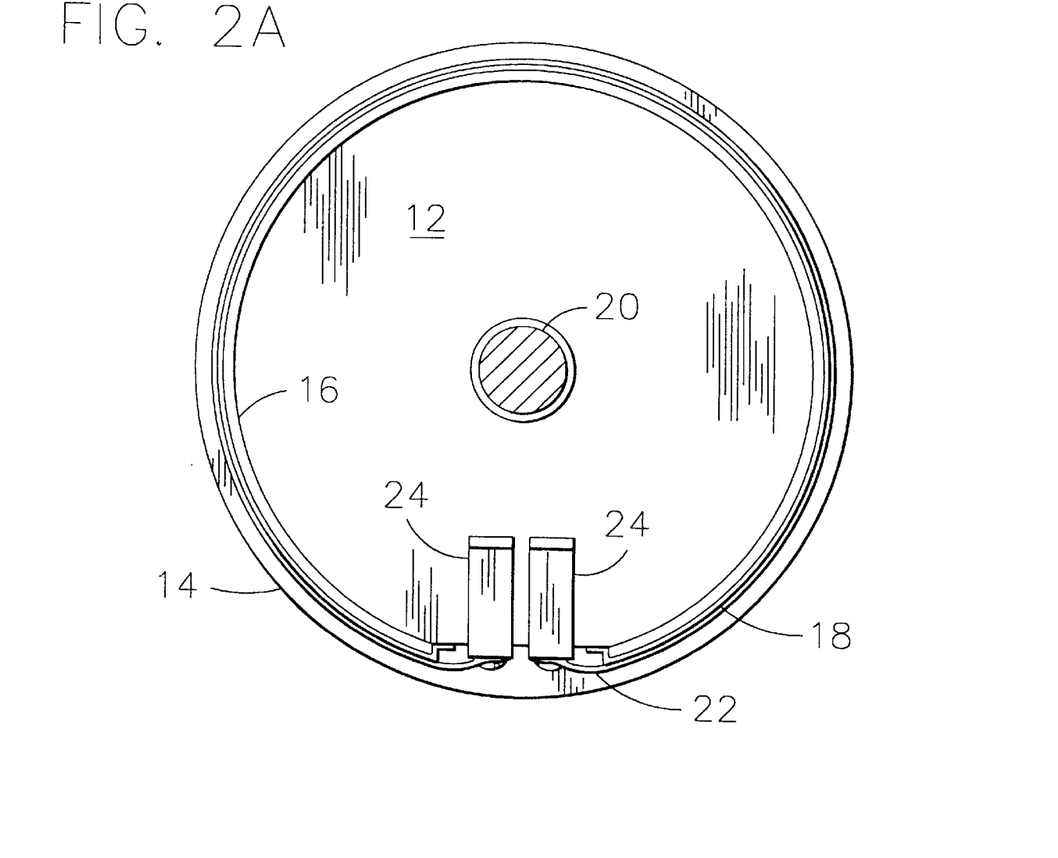
FIG. 2A is a top view of the test assembly of FIG. 1.
Figure 2B:
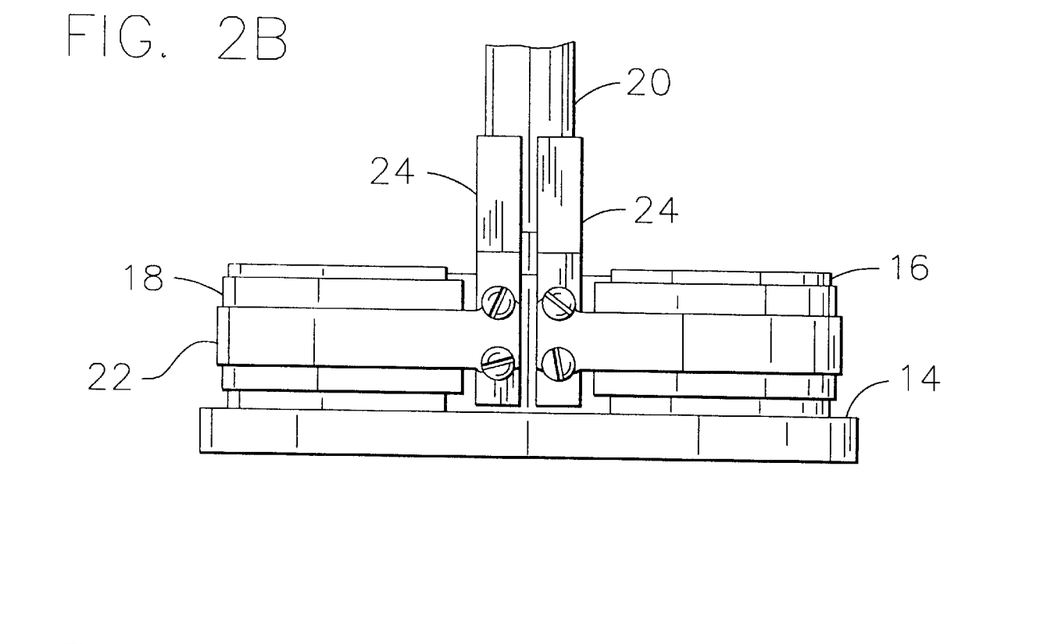
FIG. 2B is a side view of the test assembly of FIG. 1.

FIGS. 2A and 2B are top and side views, respectively, of test assembly 10 illustrating copper strip 16 as well as the dielectric layer 18. As shown, dielectric layer 18 separates copper strip 16 from a second conductive layer (i.e, a sample of a conductor 22 to be tested). As such, the dielectric layer 18 prevents shorting between the copper strip 16 and the sample conductor 22.

As an example, disk 12 has an effective diameter of 79.8 mm and is tall enough for sample conductor 22 to have a maximum width of 12.7 mm.

In this embodiment, conductor 22 forms an open-ended loop when it is positioned on disk 12. A pair of leads 24 connect the ends of conductor 22 to a current source (see FIGS. 3 and 4). For example, the leads 24 are copper posts or brackets mounted on disk 12. One end of conductor 22 is soldered to one lead 24 and the other end of conductor 22 is soldered to the other lead 24. Further, the conductive and dielectric layers 16, 22 and 18, respectively, positioned on disk 12 are adjacent one another and generally concentric. As such, test assembly 10 constitutes a capacitive element with copper strip 16 and conductor 22 acting as capacitor plates. It is to be understood that the different components of test assembly 10, although ring-shaped, are not perfectly circular due to normal manufacturing tolerances, for example. Further, the strain imposed on test assembly 10 during testing causes the layers to no longer be concentric (see FIG. 7A).

Figure 3:
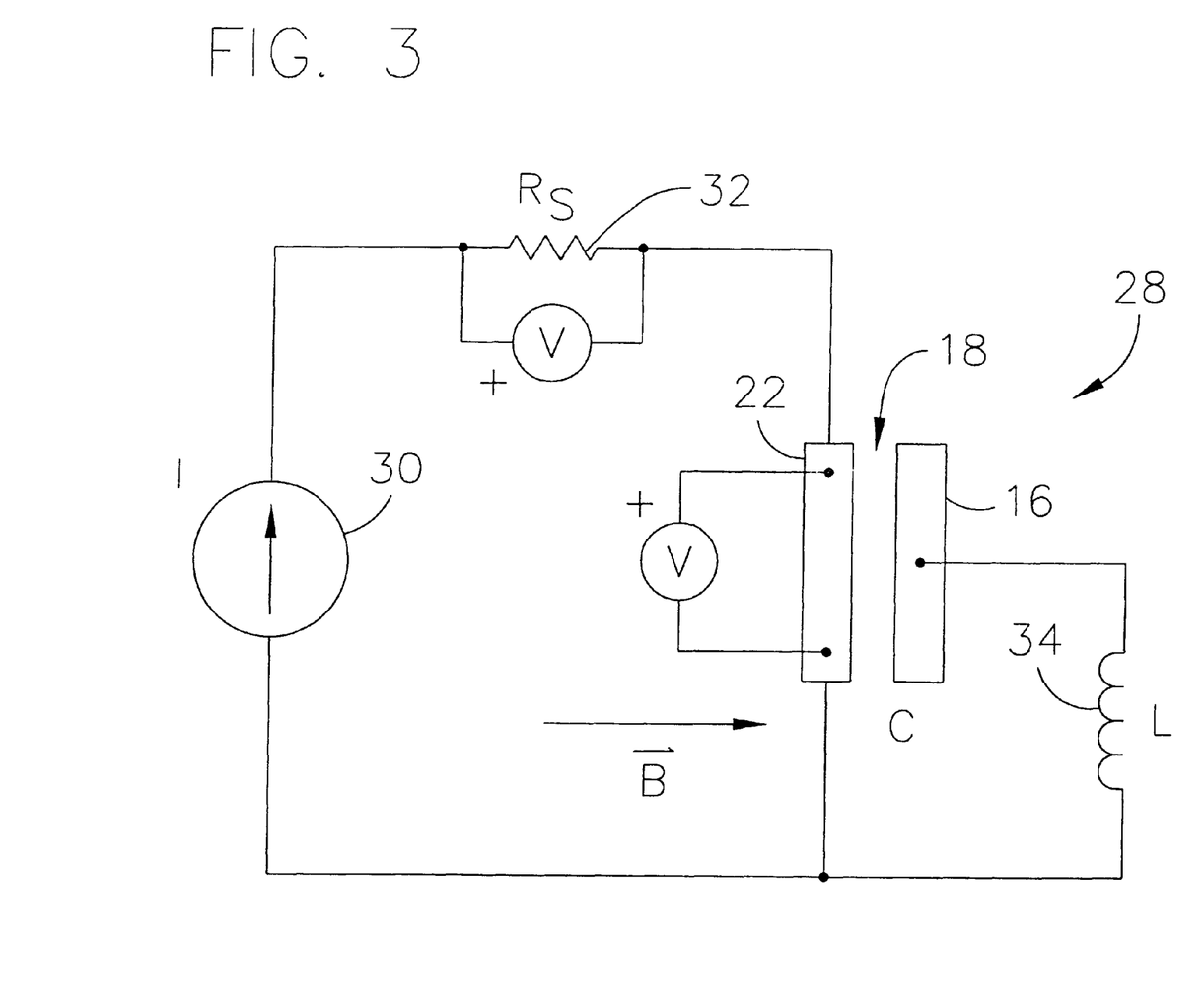
FIG. 3 is a schematic diagram of a tensile stress-strain circuit according to a preferred embodiment of the invention.

FIG. 3 illustrates a tensile stress-strain circuit 28 in the form of a schematic diagram. In general, test assembly 10 is placed in a relatively uniform magnetic field and a current source 30 of the stress-strain circuit 28 provides a variable current to conductor 22 of test assembly 10. A resistor 32 provides current sensing and an external inductor 34 is connected to test assembly 10 to form an LC circuit (see FIG. 5). As the current source 30 is varied, the current density in conductor 22 (i.e., the second conductive layer) also varies according to the general equation:

$$J = \frac{I}{wt}$$

where: J is the current density of the current in conductor 22; I is the current in conductor 22 in amps (A); and wt is the cross-sectional area of conductor 22 (i.e., the width of the second conductive layer multiplied by its thickness) in square meters (m$^2$).

As is known in the art, when a current loop is placed in a magnetic field, a force results according to:

$$d\vec{F} = I d\vec{s} \times \vec{B}$$

In this instance, the magnetic field vector is perpendicular to the current direction vector:

$$\vec{B} \perp d\vec{s}$$

As such, when a generally circular conductive layer such as conductor 22 carries current in a magnetic field, the resultant force stresses it. The stress on conductor 22 is calculated according to the general equation:

$$\sigma_c = JBr$$

where: $\sigma_c$ is the circumferential, or hoop, stress in pascals (Pa); B is the applied magnetic flux density in teslas (T); and r is the radius of the circular conductor 22 in meters (m). Note that Pa=N/m$^2$; T=Wb/m$^2$; and Wb=N·m/A.

As conductor 22 deforms from the stress, the gap between copper strip 16 and conductor 22 changes. The strain in conductor 22 (i.e., the deformation of conductor 22 resulting from the stress) is related to the stress by the sample's modulus of elasticity, or Young's modulus, E, and is determined as a function of the change in capacitor gap:

$$\epsilon_c = \frac{JBr}{E} \approx \frac{R-r}{r}$$

where: R is the new radius of the deflected circular conductor 22 such that (R−r) is the change in gap between copper strip 16 and conductor 22.

Figure 4:
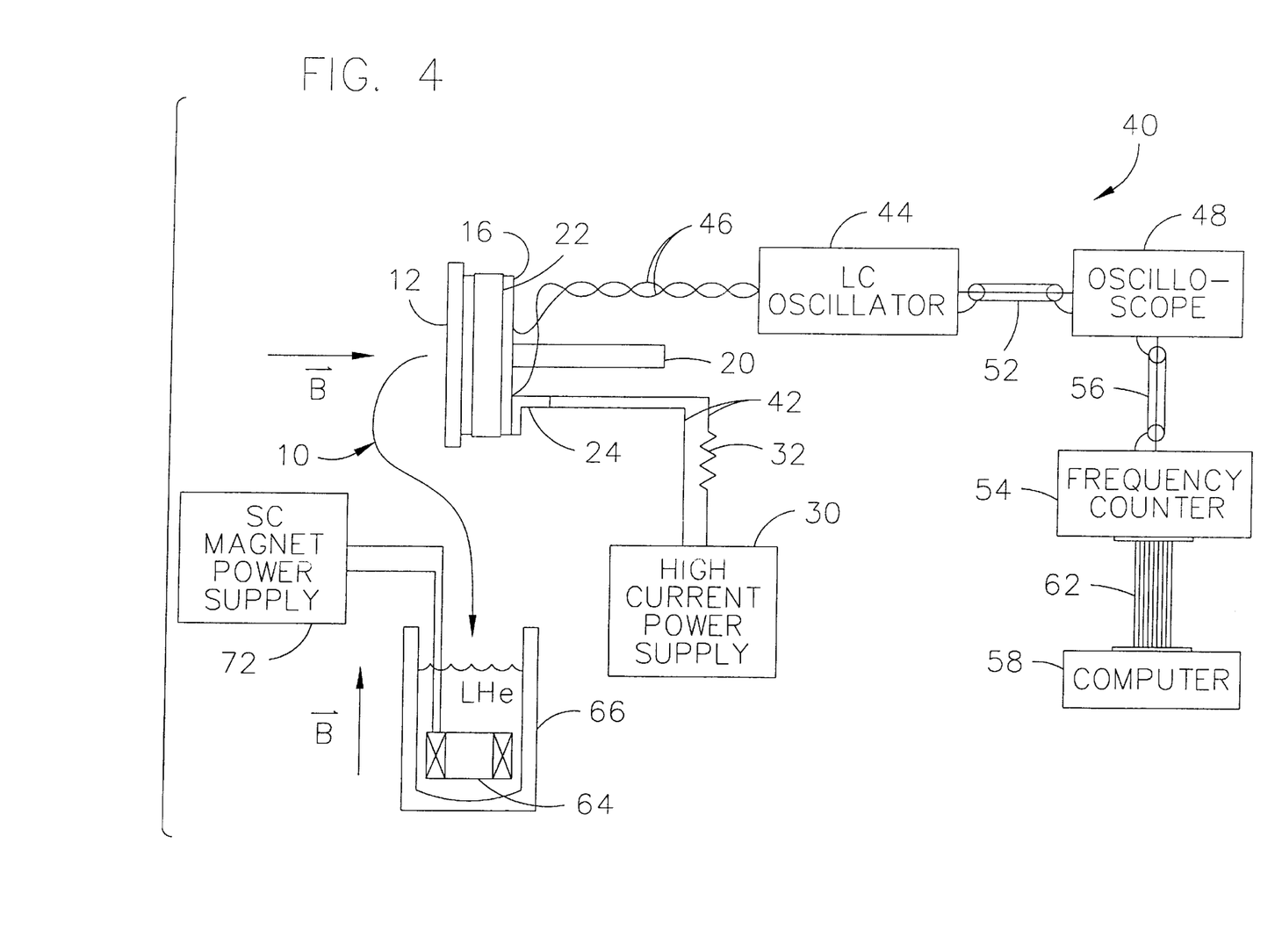
FIG. 4 is a block diagram of a test system including the tensile stress-strain circuit of FIG. 3.

Referring now to FIG. 4, a test system 40 embodying aspects of the invention is shown. The test system 40 includes test assembly 10 connected to the current source 30 via lines 42. Each lead 24 on conductor 22 is connected to one line 42 for providing current to conductor 22. As an example, current source 30 is embodied by a high current power supply such as a Hewlett-Packard HP 6681 System DC Power Supply having a maximum current of 580 A and a maximum voltage of 8 V. Since current source 30 is capable of providing high levels of current to test assembly 10, lines 42 are embodied by welding cables, for example, which can carry the high current.

In a preferred embodiment of the invention, test assembly 10 is connected to an LC oscillator circuit 44 (shown in detail in FIG. 5) via lines 46 (e.g., twisted pair cable). As shown, one of the lines 46 is connected to one of the leads 24 and the other one of the lines 46 is connected directly to copper strip 16. For clarity, the LC oscillator circuit 44 is illustrated separately from test assembly 10. However, it is to be understood that test assembly 10 constitutes the capacitive element of LC oscillator 44. In this regard, LC oscillator 44 is represented in FIG. 3 by the external inductor 34 connected to the copper strip 16 and conductor 22 of test assembly 10.

As shown in FIG. 4, LC oscillator circuit 44 is connected to means for measuring the frequency of oscillation. An oscilloscope 48 connected to LC oscillator circuit 44 via line 52 (e.g., coaxial cable) provides a visual display of the oscillating signal. A frequency counter 54, connected to the oscilloscope 48 via line 56 (e.g., coaxial cable), measures the signal's frequency. Preferably, oscilloscope 48 is embodied by a conventional oscilloscope such as a Tektronics TDS 744 A Digitizing Oscilloscope and the frequency counter 54 is, for example, a Hewlett-Packard HP 5334 A Universal Counter. A personal computer 58 connected to frequency counter 54 via line 62 (e.g., GPIB cable) processes a number of parameters of system 40, including the frequency count, for determining the Lorentz force tensile stress-strain and critical current density fatigue properties of conductor 22 held by test assembly 10. A Macintosh Quadra 650 computer equipped with National Instruments LabVIEW 3.0.1 software constitutes a suitable computer 58.

According to the invention, test system 40 also includes a magnetic field source. In this instance, system 40 uses a superconducting magnet 64 immersed in a bath of liquid helium (LHe). As shown in FIG. 4, a dewar 66, or other suitable container, holds the LHe in which the magnet 64 is immersed. Test assembly 10 is positioned in the bore of superconducting magnet 64 by its support rod 20 and a power supply 72 provides power to magnet 64 for establishing a generally uniform magnetic field. In this manner, system 40 performs at cryogenic temperatures (e.g., approximately 5 K or below). As an example, magnet 64 is an American Magnetics Inc. 9 T Nb—Ti Solenoid Magnet having an active region with a bore diameter of 101.6 mm and a bore length of 220.0 mm. The maximum desired field for such a magnet is 9.0 T. The magnet power supply 72 is preferably embodied by a Cryomagnetics IPS-100 Magnet Power System.

It is to be understood that other magnetic field sources may be used without deviating from the scope of the invention. For example, greater magnetic field strength may be desired under certain circumstances. Further, the type of material being tested (i.e., conductor 22) as well as the type of magnetic field source (i.e., magnet 64) determines the type of cryogen(s) used for cooling either or both. For example, other cryogens, such as liquid nitrogen ($LN_2$), are at a temperature of approximately 100 K or below.

In this instance, the radius of disk 12 and the magnetic field provided by magnet 64 are essentially fixed. Thus, the stress on conductor 22 varies directly with the current density. As a result, the capacitance of test assembly 10 varies with strain. Since the inductance of LC oscillator circuit 44 is essentially fixed, the frequency of oscillation measured by frequency counter 54 also varies with strain. LC oscillator 44 outputs an approximately 1 MHz sinewave, for example, that is related to capacitance and inductance according to:

$$f = \frac{1}{2\pi\sqrt{LC}}$$

Figure 7A:
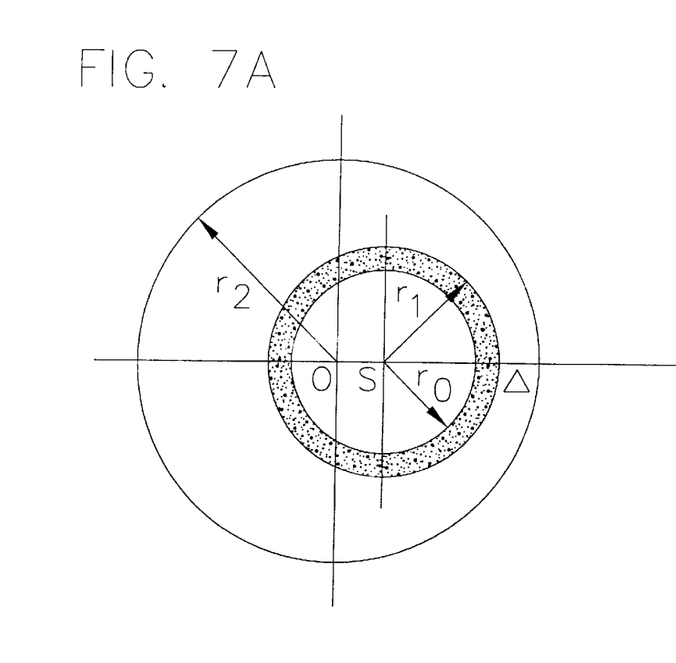
FIGS. 7A and 7B illustrate various parameters for use in calculating fractional strain according to a preferred embodiment of the invention.
Figure 7B:
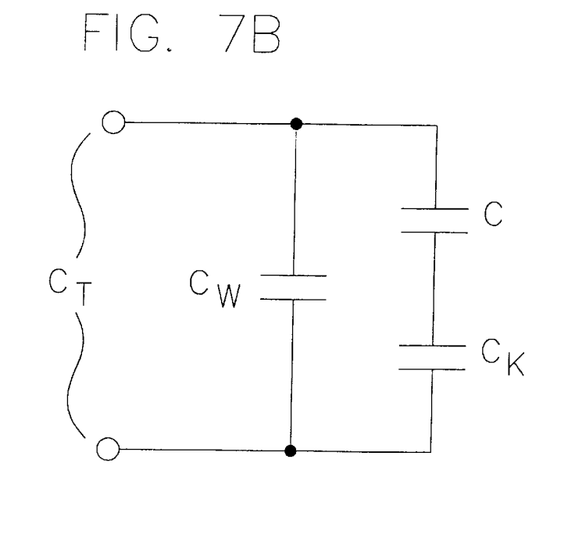

In a preferred embodiment of the invention, computer 58 acquires several parameters relating to the Lorentz force tensile stress-strain and critical current density fatigue test from appropriate sensors, excitation current sources and digital multimeters. For example, not only does computer 58 acquire a frequency measurement, it also acquires the current and voltage of conductor 22, the magnetic field strength and voltage of magnet 64, the temperature of disk 12 and the level of liquid helium in dewar 66 level. Based on the principle relating capacitance and inductance to frequency, computer 58 processes the acquired parameters to determine the stress-strain and fatigue characteristics of the sample conductor 22. One generalized procedure for determining fractional strain as a function of capacitance, effective inductance and frequency is outlined below with reference to FIGS. 7A and 7B:

$$L_E = \frac{1}{4\pi^2 f^2 C_{CAL}}, \quad C_T = \frac{1}{4\pi^2 f^2 L_E}$$

$$C_T = C_W + \frac{1}{1/C_K + 1/C}$$

$$C_K = \frac{2\pi K_k \epsilon_0 w}{\ln(r_1/r_0)}$$

$$\frac{1}{C} = \frac{1}{C_T - C_W} - \frac{1}{C_K}$$

$$C_T = C_W + \frac{1}{1/C_K + 1/C_A}$$

$$C_A = \frac{2\pi K_A \epsilon_0 w}{\ln(r_2/r_1)}, \quad s \approx 0$$

$$\frac{1}{C_A} = \frac{1}{C_T - C_W} - \frac{1}{C_K}$$

$$\ln(r_2/r_1) = \frac{2\pi K_A \epsilon_0 w}{C_A}$$

$$r_2/r_1 - 1 = r_2 - r_1 \approx \Delta, \quad r_2 = r_1 + s + \Delta$$

$$r_2 = \frac{r_1^2 - (r_1 - \Delta)^2}{2[r_1 \cosh(2\pi K \epsilon_0 w/C) - (r_1 + \Delta)]}$$

$$\epsilon = \frac{R_2 - r_2}{r_2}$$

where: $L_E$ is the effective inductance and $C_{CAL}$ is the calibration capacitance of LC oscillator circuit; $C_T$ is the total capacitance; $C_W$ is the capacitance of the twisted pair wire; $C_K$ is the capacitance of the insulation (e.g., the Kapton tape); and $C_A$ is the capacitance of the air between the layers.

Figure 5:
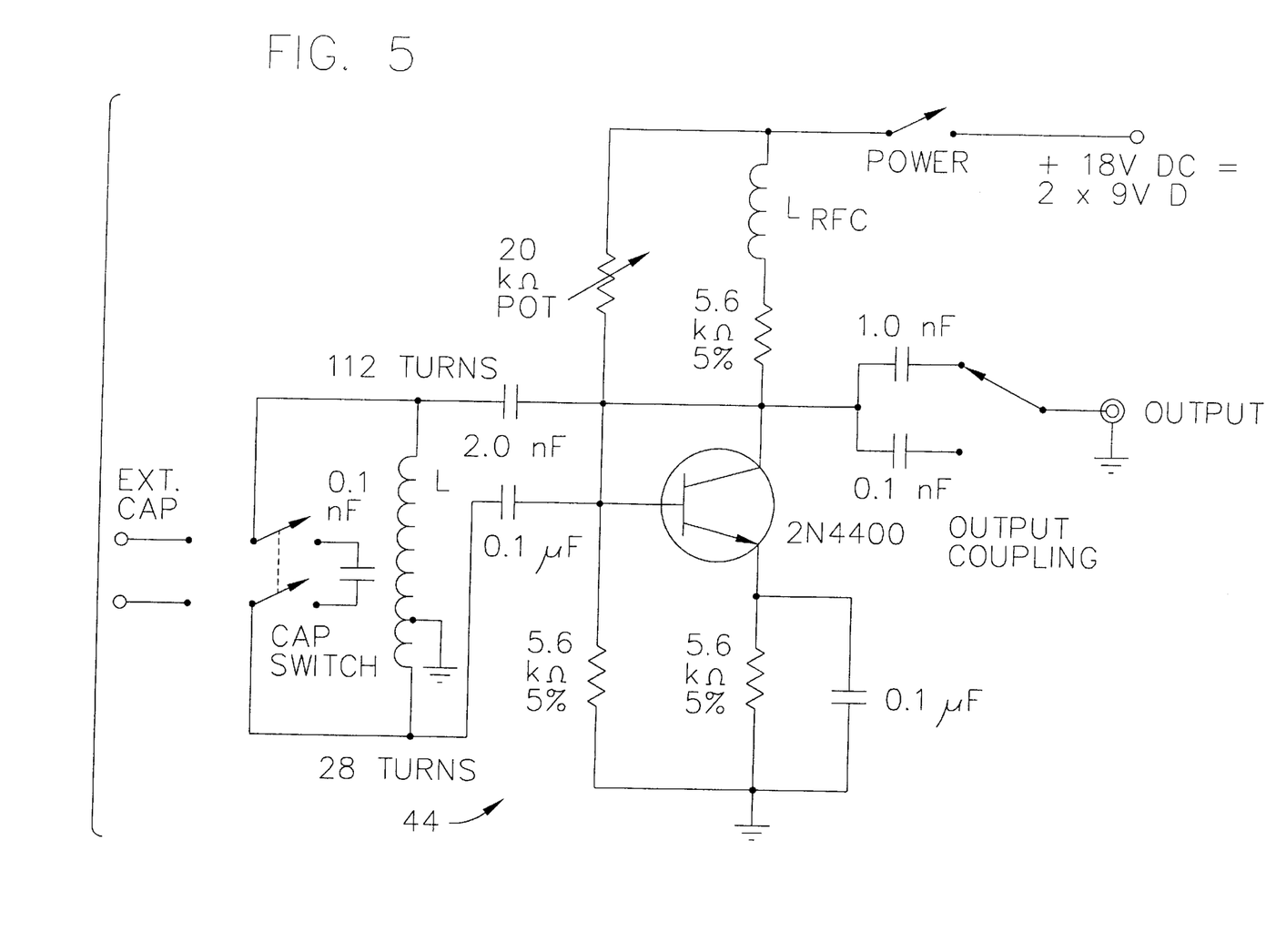
FIG. 5 is a schematic diagram of an LC oscillator circuit of the test system of FIG. 4.

FIG. 5 illustrates a preferred embodiment of LC oscillator circuit 44 in the form of a schematic diagram. As shown in FIG. 5, LC oscillator circuit 44 is preferably embodied by a Hartley-type circuit. It is to be understood, however, that other types of oscillator circuits (e.g., a Colpitt oscillator circuit) are also contemplated. In this instance, LC oscillator circuit 44 provides an external inductance of approximately 250 $\mu$H.

In operation, test system 40 is particularly well suited for determining the tensile stress-strain characteristics of high temperature superconductor (HTS) materials such as $Bi_2Sr_2CaCu_2O_x$/Ag (BSCCO/Ag) and Ag-alloy composite superconductors. The stress-strain characteristics advantageously provide information regarding the critical current density, $J_c$, of these materials. Since applied stress is a function of magnetic field strength, its range is limited by the bore size and magnetic field of magnet 64 in addition to the maximum current density in the sample conductor 22. For resistive materials, J is limited by heating and continuous, simultaneous, I·V measurements on conductor 22, for example, is desired to provide monitoring of the temperature of conductor 22. For HTS samples, heating becomes of interest if $J > J_c(B,T)$. In this case, changes in $J_c$ with cycling are monitored in real-time.

The strain in conductor 22 (i.e., the deformation of conductor 22 resulting from the stress) is then determined by measuring the change in the capacitor gap as described above. According to a preferred test method, varying the current in the conducting sample 22 and observing the shift the frequency of the LC oscillator circuit 44 provides a stress versus strain curve for conductor 22. Fatigue experiments can be accomplished by cycling the current in conductor 22 at a desired rate and monitoring the resultant strain.

A preferred testing method includes first testing a Ag sample for benchmarking purposes. After confirming the accuracy of the test system for Ag, sheath materials of annealed Ag tape and oxidized Ag1.2at % Mg tape or powder-in-tube (PIT) AgMg/BSCCO tape, for example, may be tested.

Although not limited to superconductors, the above-described test system 40 is particularly useful for measuring the stress, strain and fatigue behavior of superconductors. Even for non-superconducting materials, it is desirable to cool the sample to minimize the effects of thermal expansion.

Figure 6:
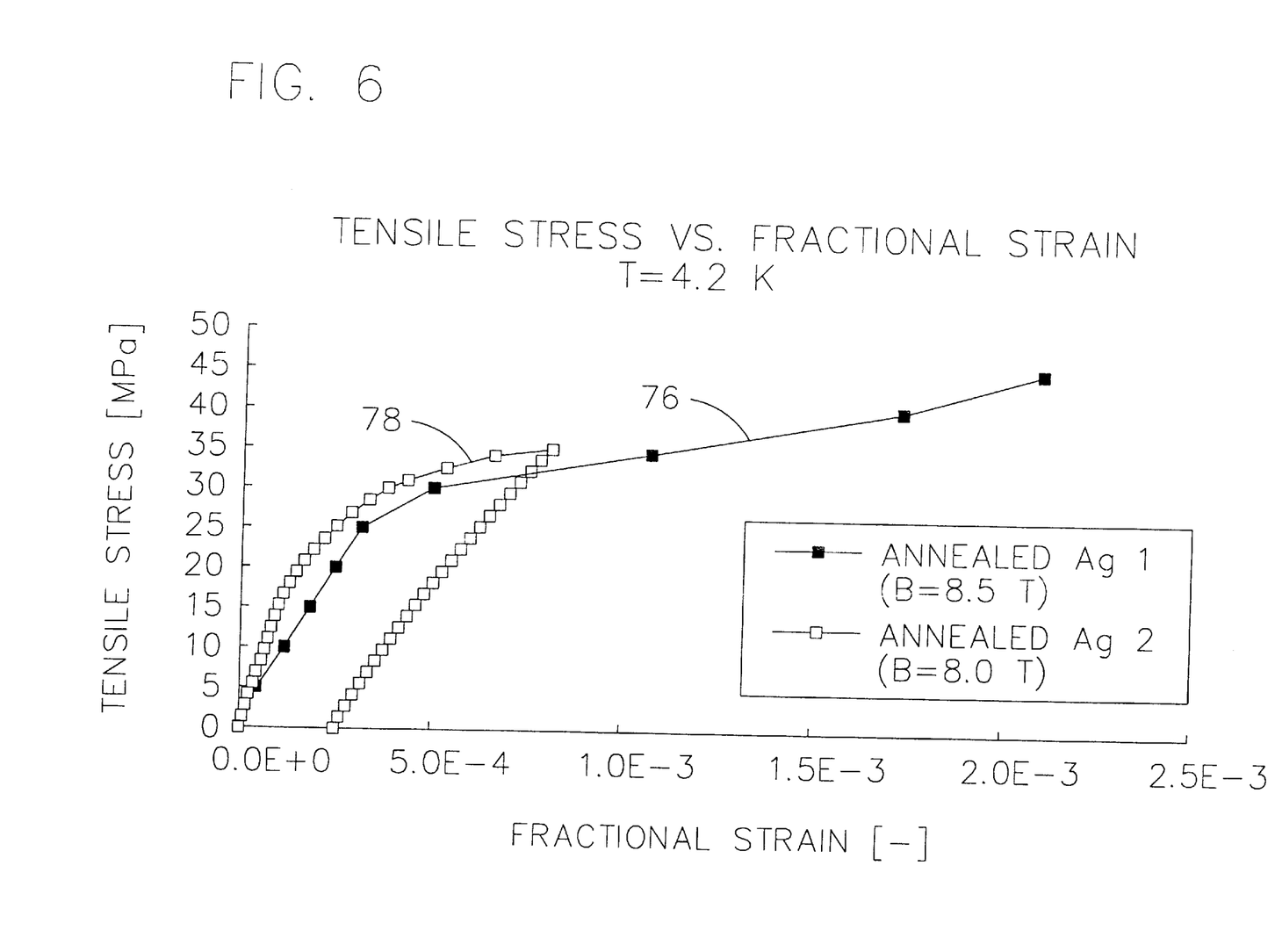
FIG. 6 are exemplary stress-strain curves illustrating results of tensile stress-strain testing with the test system of FIG. 4.

FIG. 6 illustrates the results of stress-strain tests performed by the LHe temperature test system 40 embodying the present invention on samples of annealed Ag at 4.2 K. In this test, the temperature of the samples was monitored via I·V measurements and previously measured resistivity-temperature data. A curve 76 shows increasing stress past permanent yield of the sample. FIG. 6 also illustrates an up/down cycle (i.e., increasing and then decreasing current) at relatively high strain in the form of a curve 78. In the instance of J exceeding $J_c$ to introduce the large strain, heating may occur and the resultant thermal expansion of the material will affect the stress-strain values. Continued cycling at current levels below permanent yield provides the critical current density fatigue characteristic of conductor 22.

One benefit of the present system is that it permits in situ $J_c(\epsilon)$ dependence measurements of superconducting tape samples. It is also very instrumental in experimentally measuring the $J_c(\epsilon)$ of the individual turns of a superconducting magnet and comparing it with the calculated values. If the current density of conductor 22 stays below the superconducting critical current density, heating will be absent. Advantageously, the test arrangement embodying the present invention does not require moving parts and load cells.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for determining stress-strain characteristics comprising:

a first conductive layer;

a sample defining a second conductive layer;

a test assembly adapted to receive the first and second conductive layers and a dielectric layer adjacent each of the conductive layers, said dielectric layer separating the conductive layers from each other, said layers being generally ring-shaped and concentric when received by the test assembly;

a magnetic field source applying a magnetic field to the test assembly including the layers received by the test assembly;

a variable current source providing current to the second conductive layer thereby causing stress thereon; and a circuit for measuring a change in capacitance between the conductive layers when the current in the second conductive layer is varied whereby the stress and strain characteristics of the sample are determined as a function of the applied magnetic field and the capacitance change.

2. The system of claim 1 wherein the test assembly comprises an insulative disk.

3. The system of claim 2 wherein the disk includes a flange about its periphery engaging the first conductive layer when the first conductive layer is received by the test assembly.

4. The system of claim 1 wherein the first conductive layer is copper.

5. The system of claim 1 wherein the second conductive layer comprises a superconductor material.

6. The system of claim 1 wherein the second conductive layer includes leads by which the current source is connected to the second conductive layer.

7. A system for determining stress-strain characteristics comprising:

a test assembly adapted to receive first and second conductive layers and a dielectric layer adjacent each of the conductive layers, said dielectric layer separating the conductive layers from each other, said layers being generally ring-shaped and concentric when received by the test assembly;

a magnetic field source applying a magnetic field to the test assembly, said magnetic field source comprising a solenoid magnet having a bore and said test assembly being positioned in the bore of the solenoid magnet;

a variable current source providing current to the second conductive layer; and a circuit for measuring a change in capacitance between the conductive layers when the current in the second conductive layer is varied whereby the stress and strain characteristics of the second conductive layer are determined as a function of the capacitance change.

8. The system of claim 7 wherein the solenoid magnet comprises a superconducting solenoid magnet operating at cryogenic temperatures.

9. The system of claim 1 wherein the circuit for measuring the capacitance change includes an LC oscillator circuit.

10. The system of claim 9 wherein the test assembly comprises a capacitive element of the LC oscillator circuit.

11. The system of claim 9 wherein the LC oscillator circuit generates an oscillatory signal having a frequency which is a function of the capacitance change and further comprising a frequency counter for measuring the frequency of the signal.

12. A method for determining stress-strain characteristics comprising the steps of:

providing a capacitive element having a first conductive layer and a sample separated by a dielectric layer, said sample defining a second conductive layer, said layers of the capacitive element being generally ring-shaped and concentric;

positioning the capacitive element in a magnetic field;

providing a current to the second conductive layer thereby causing stress thereon;

varying the current; and measuring the change in capacitance between the conductive layers of the capacitive element when the current in the second conductive layer is varied whereby the stress and strain characteristics of the sample are determined as a function of the magnetic field and the capacitance change.

13. The method of claim 12 wherein the step of providing the capacitive element comprises positioning the layers on an insulative disk.

14. The method of claim 13 wherein the step of positioning the layers includes engaging a flange about the periphery of the disk with the first conductive layer.

15. The method of claim 12 wherein the first conductive layer is copper.

16. The method of claim 12 wherein the second conductive layer comprises a superconductor material.

17. The method of claim 12 wherein the second conductive layer includes leads and further comprising the step of connecting the current source to the second conductive layer via the leads.

18. A method for determining stress-strain characteristics comprising the steps of:

providing a capacitive element having first and second conductive layers separated by a dielectric layer, said layers of the capacitive element being generally ring-shaped and concentric;

positioning the capacitive element in a magnetic field, said step of positioning the capacitive element in a magnetic field comprising positioning the capacitive element in the bore of a solenoid magnet;

providing a current to the second conductive layer;

varying the current; and measuring the change in capacitance between the conductive layers of the capacitive element when the current in the second conductive layer is varied whereby the stress and strain characteristics of the second conductive layer are determined as a function of the capacitance change.

19. The method of claim 18 wherein the solenoid magnet comprises a superconducting solenoid magnet operating at cryogenic temperatures.

20. The method of claim 12 further comprising the step of providing an LC oscillator circuit that includes the capacitive element, said LC oscillator circuit generating an oscillatory signal having a frequency which is a function of the capacitance change, and further comprising the step of measuring the frequency of the signal when the current in the second conductive layer is varied whereby the change in capacitance is determined.

21. A test assembly for use with a magnetic field source and a current source to determine stress-strain characteristics comprising:

a generally circular disk adapted to be positioned in a magnetic field applied by the magnetic field source;

a first conductive layer positioned around the periphery of the disk;

a dielectric layer positioned on the first conductive layer;

a sample defining a second conductive layer positioned on the dielectric layer, said second conductive layer comprising a superconductor, said dielectric layer separating the first and second conductive layers, said layers being generally ring-shaped and concentric when positioned on the disk; and leads adapted to connect the second conductive layer to the current source.

* * * * *